(12) United States Patent
Park

(10) Patent No.: US 7,915,613 B2
(45) Date of Patent: Mar. 29, 2011

(54) ORGANIC LIGHT EMITTING DISPLAY DEVICE AND METHOD OF MANUFACTURING THE SAME

(75) Inventor: Seung-Kyu Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 914 days.

(21) Appl. No.: 11/758,976

(22) Filed: Jun. 6, 2007

(65) Prior Publication Data

US 2008/0150417 A1    Jun. 26, 2008

(30) Foreign Application Priority Data

Dec. 20, 2006 (KR) .................. 10-2006-0131045

(51) Int. Cl.
*H01L 29/10* (2006.01)
(52) U.S. Cl. .............. 257/59; 257/72; 257/E51.018; 257/E51.019; 257/E51.022; 438/158
(58) Field of Classification Search .............. 257/59, 257/72, E51.018, E51.019, E51.022; 438/158
See application file for complete search history.

(56) References Cited

U.S. PATENT DOCUMENTS

| | | | | |
|---|---|---|---|---|
| 2003/0122140 A1* | 7/2003 | Yamazaki et al. | ............. | 257/88 |
| 2003/0205970 A1* | 11/2003 | Park et al. | ............. | 313/506 |
| 2005/0023969 A1* | 2/2005 | Omata et al. | ............. | 313/504 |
| 2005/0082534 A1* | 4/2005 | Kim et al. | ............. | 257/72 |
| 2007/0152217 A1* | 7/2007 | Lai et al. | ............. | 257/59 |
| 2007/0200492 A1* | 8/2007 | Cok et al. | ............. | 313/506 |
| 2008/0012484 A1* | 1/2008 | Park et al. | ............. | 313/509 |
| 2008/0024402 A1* | 1/2008 | Nishikawa et al. | ............. | 345/82 |

FOREIGN PATENT DOCUMENTS

| | | |
|---|---|---|
| JP | 2004303609 | 10/2004 |
| KR | 2006-33630 | 4/2006 |
| KR | 2006-65366 | 6/2006 |

* cited by examiner

*Primary Examiner* — Thanh V Pham
*Assistant Examiner* — Maria Ligai
(74) *Attorney, Agent, or Firm* — H.C. Park & Associates, PLC

(57) ABSTRACT

Disclosed is an organic light emitting display device including a substrate having a plurality of sub-pixel areas, a switching thin film transistor formed on each of the sub-pixel areas, a driving thin film transistor connected to the switching thin film transistor, a color filter formed on at least one of sub-pixel areas, an insulating layer formed on the switching thin film transistor, the driving thin film transistor and the color filter, a pixel electrode connected to the driving thin film transistor, an organic light emitting member formed on the pixel electrode, and a common electrode formed on the organic light emitting member. The insulating layer has a groove. The groove is formed along a boundary of the pixel electrode. The groove has a width of about 0.2 to about 4 μm. The groove has a depth of about 0.2 to about 4 μm. The pixel electrode has an edge declined in the groove.

12 Claims, 17 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2006-0131045, filed on Dec. 20, 2006, which is hereby incorporated by reference for all purposes as if fully set forth herein.

BACKGROUND OF THE INVENTION (a) Field of the Invention

The present invention relates to an organic light emitting display device and a method of manufacturing the display device.

(b) Description of the Related Art

An organic light emitting display device includes an anode, a cathode and an organic layer interposed between the anode and the cathode. Electrons from the cathode and holes from the anode form excitons in the organic layer. The organic layer is illuminated by the energy emitted from the excitons.

Generally, the organic light emitting display device is of two types, a passive matrix type and an active matrix type. The active matrix type organic light emitting display device has a thin film transistor as a switching device.

A conventional organic light emitting display device has a partition that defines a pixel. Usually formation of the partition takes a long time during the manufacturing process. Moreover, moisture, oxygen or solvent permeated in the partition damages the organic layer and reduces the lifetime of the display device.

SUMMARY OF THE INVENTION

A display device according to an embodiment of the present invention includes an organic light emitting display device including a substrate having a plurality of sub-pixel areas, a switching thin film transistor formed on each of the sub-pixel areas, a driving thin film transistor connected to the switching thin film transistor, a color filter formed on at least one of the sub-pixel areas, an insulating layer formed on the switching thin film transistor, the driving thin film transistor and the color filter, a pixel electrode connected to the driving thin film transistor, an organic light emitting member formed on the pixel electrode, and a common electrode formed on the organic light emitting member. The insulating layer has a groove. The groove is formed along a boundary of the pixel electrode. The groove has a width of about 0.2 to about 4 µm. The groove has a depth of about 0.2 to about 4 µm. The pixel electrode has an edge declined in the groove.

A display device according to another embodiment of the present invention includes a substrate having a plurality of sub-pixel areas, a switching thin film transistor formed on each of the sub-pixel areas, a driving thin film transistor connected to the switching thin film transistor, an insulating layer formed on the driving thin film transistor, a pixel electrode connected to the driving thin film transistor, an organic light emitting member contacting an entire surface of the pixel electrode, and a common electrode formed on the organic light emitting member. The insulating layer has a groove. The groove is formed along a boundary of the pixel electrode. The pixel electrode has an edge declined in the groove.

According to a method of forming the display device, a switching thin film transistor and a driving thin film transistor are formed on a substrate in a sub-pixel area. A color filter is formed on at least one of the sub-pixel areas. An insulating layer having a grove is formed on the switching thin film transistor, the driving thin film transistor and the color filter. A pixel electrode having an edge declined in the groove is formed on the insulating layer. A light emitting member is formed on the pixel electrode. A common electrode is formed on the organic light emitting member.

DETAILED DESCRIPTION OF EMBODIMENTS

Figure 1:
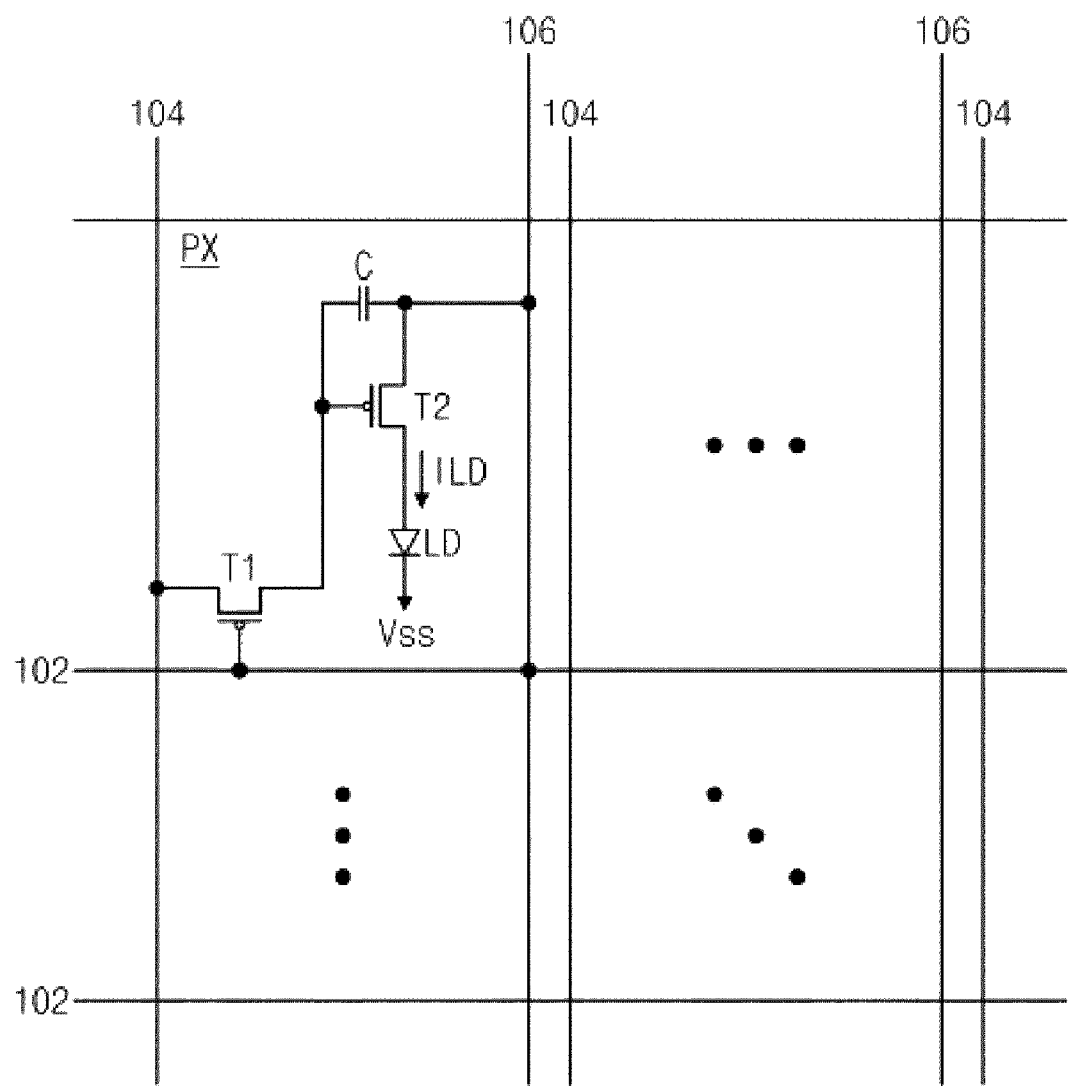
FIG. 1 is an equivalent circuit diagram of a display device according to an embodiment of the invention.
Figure 2:
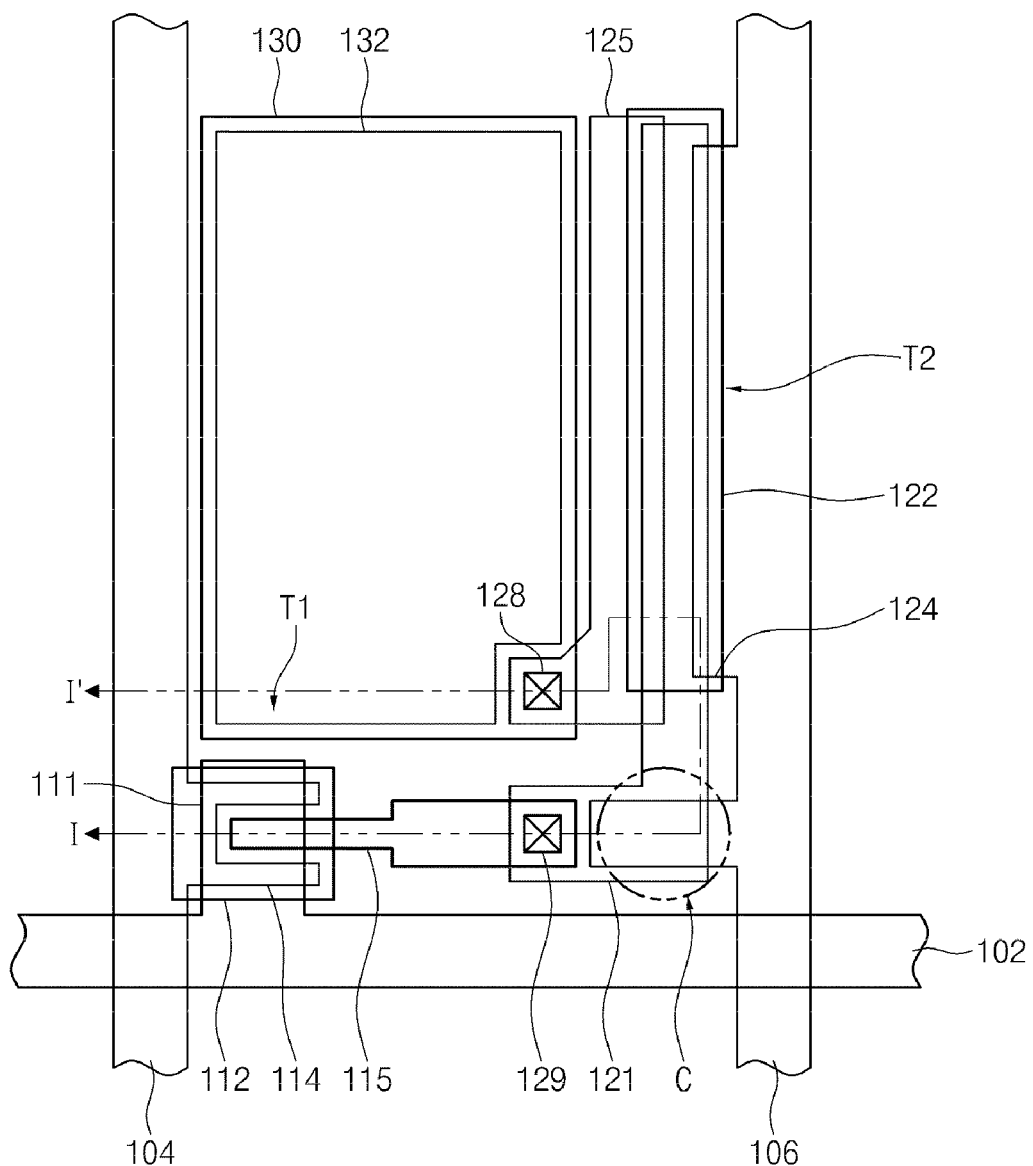
FIG. 2 is a plan view of the display device of FIG. 1.
Figure 3:
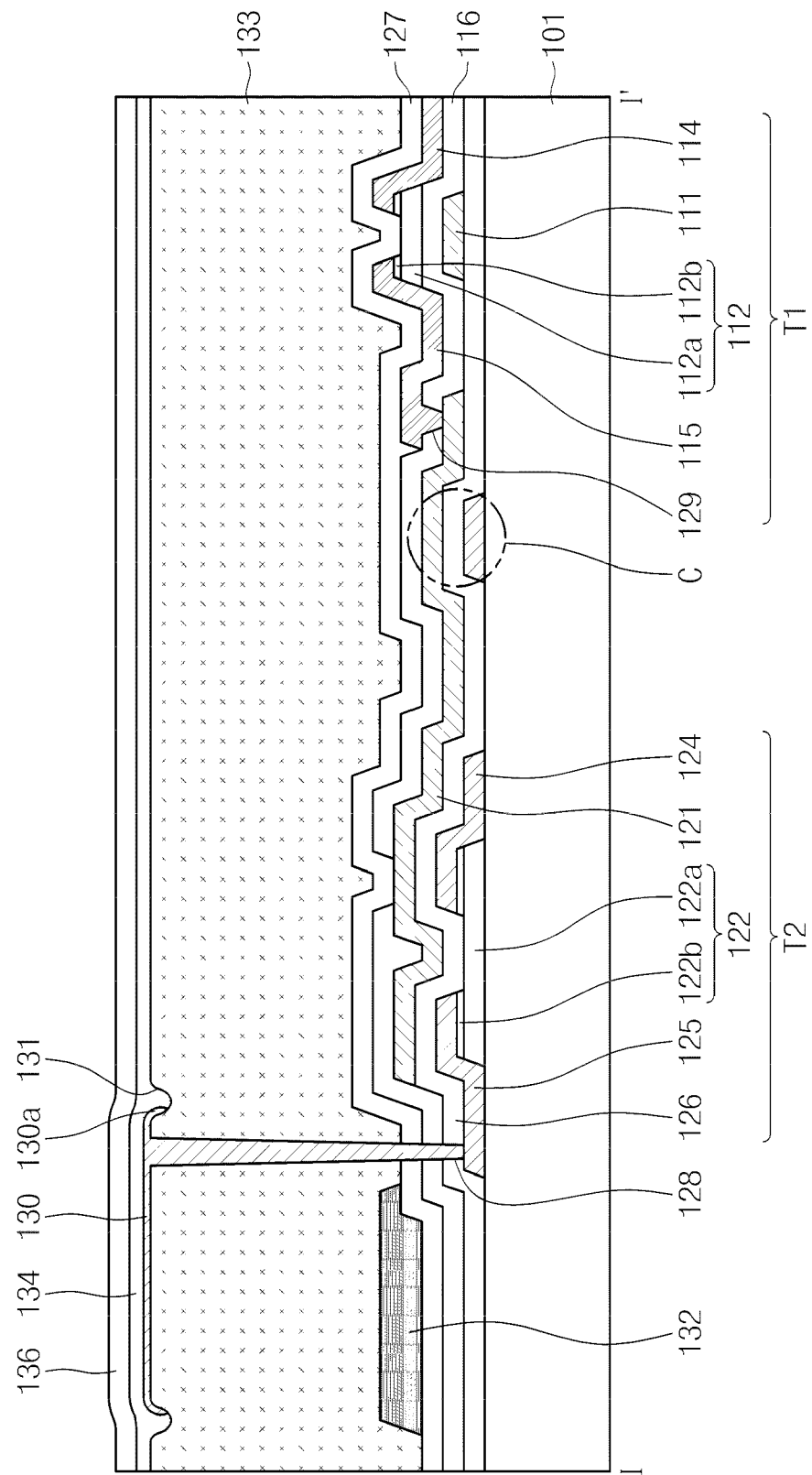
FIG. 3 is a cross-sectional view taken along the line I'-I of FIG. 2.
Figure 4:
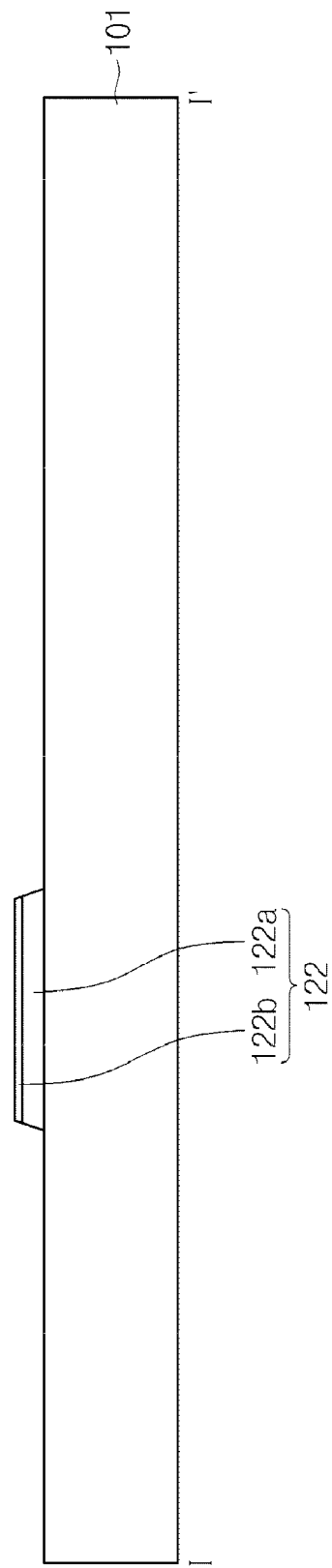
FIGS. 4 to 11 and 14 are cross-sectional views illustrating a method of manufacturing the display device of FIG. 2.
Figure 5:
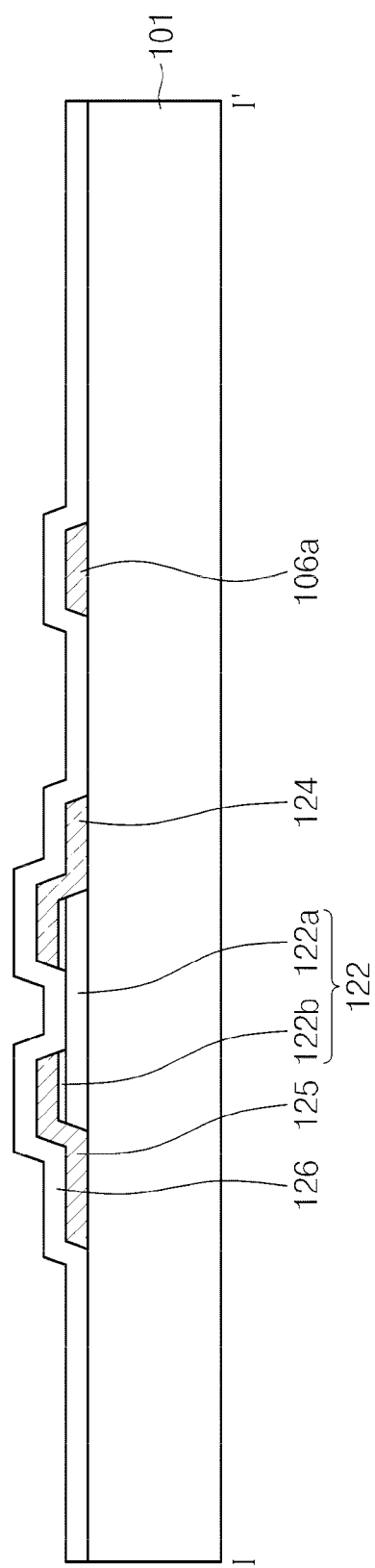
Figure 6:
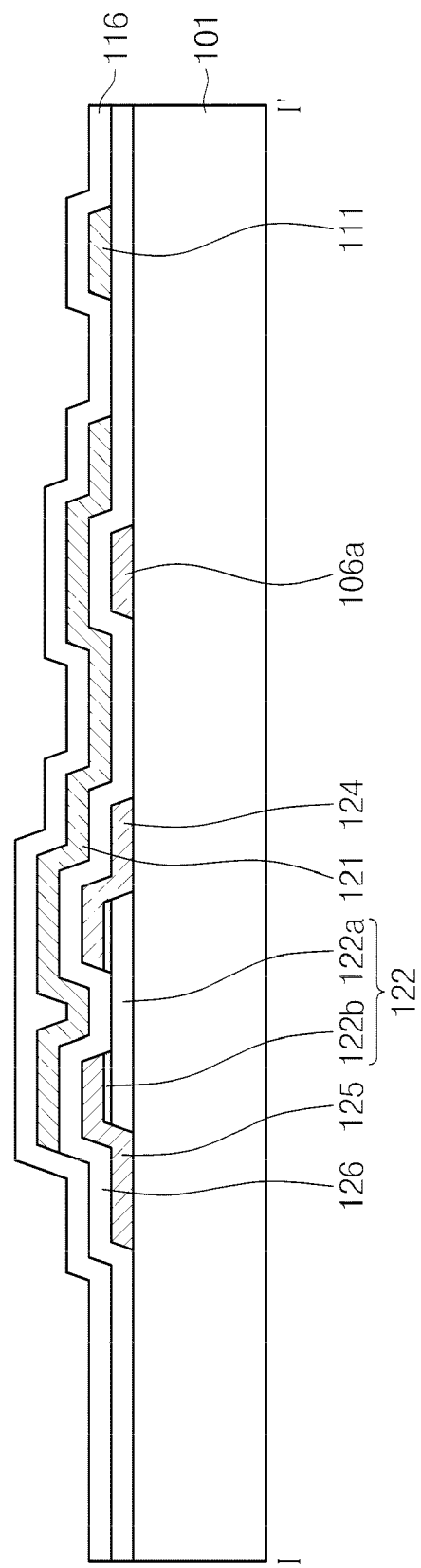
Figure 7:
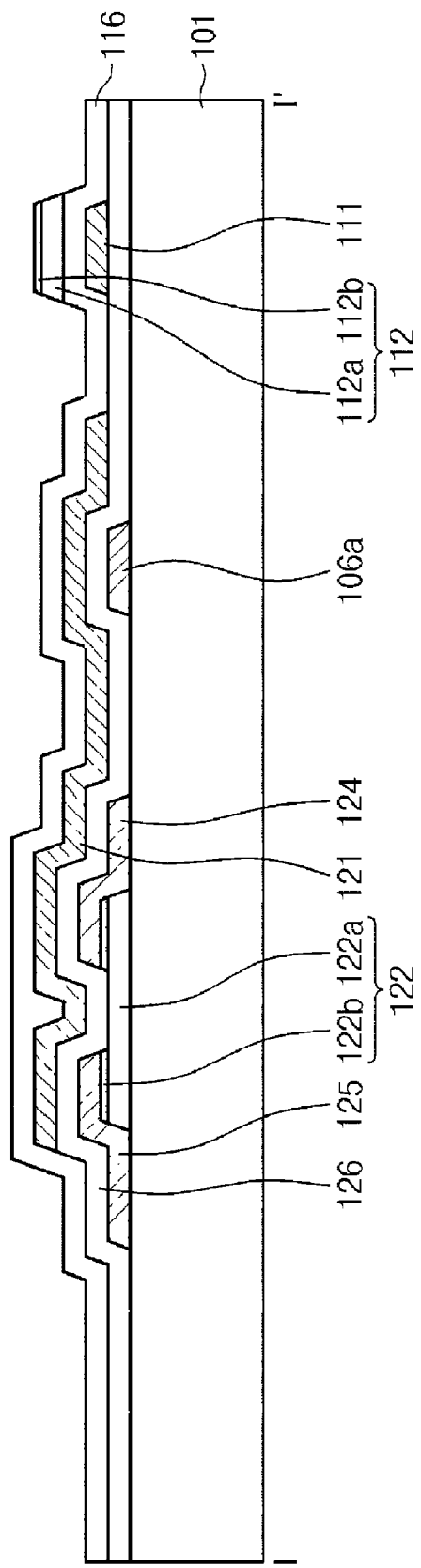
Figure 8:
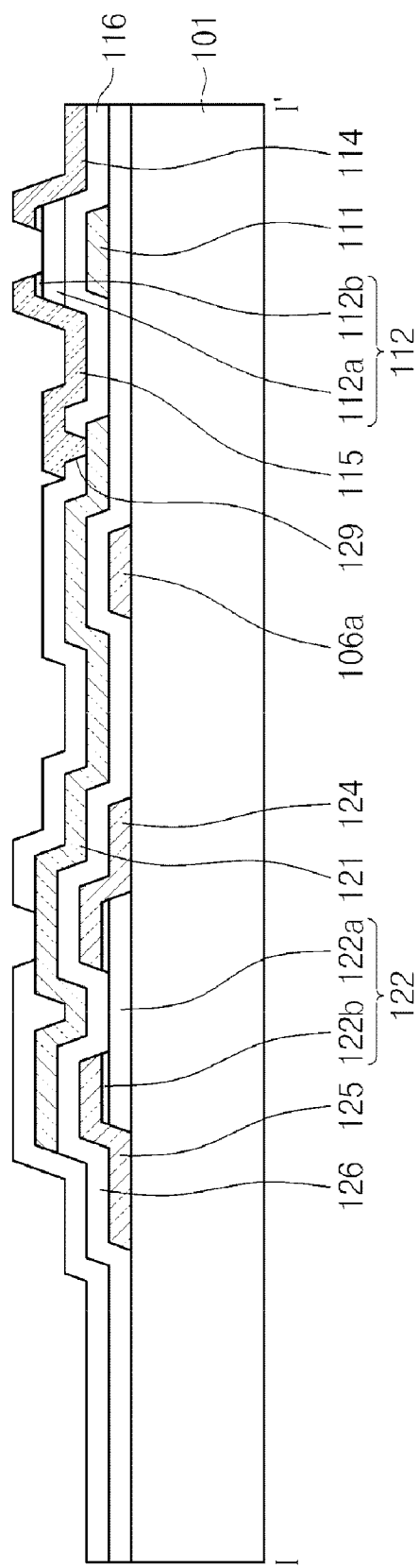
Figure 9:
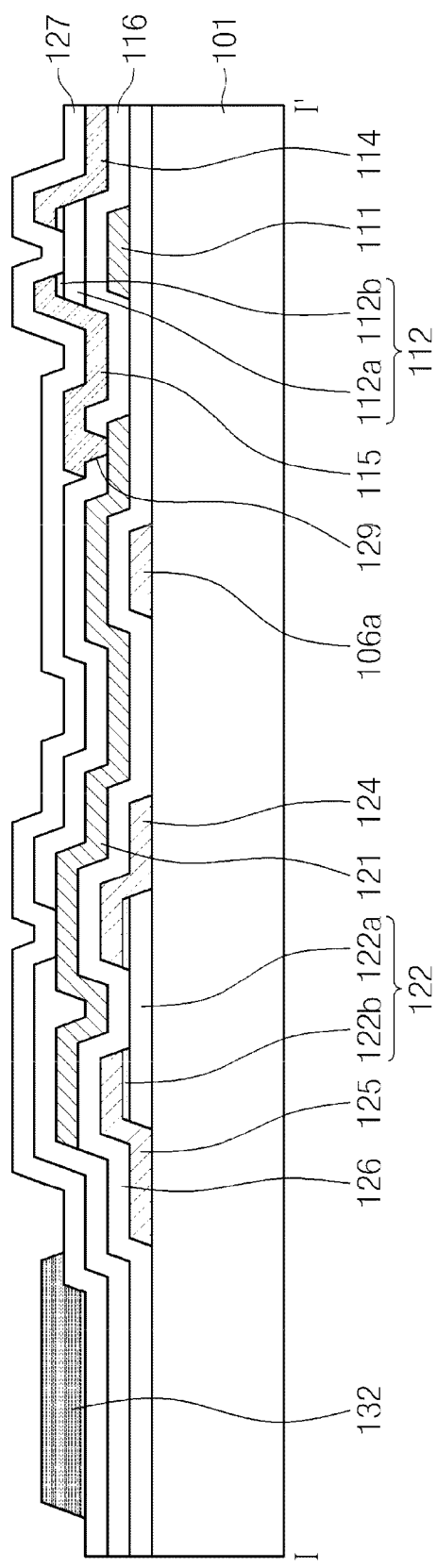
Figure 10:
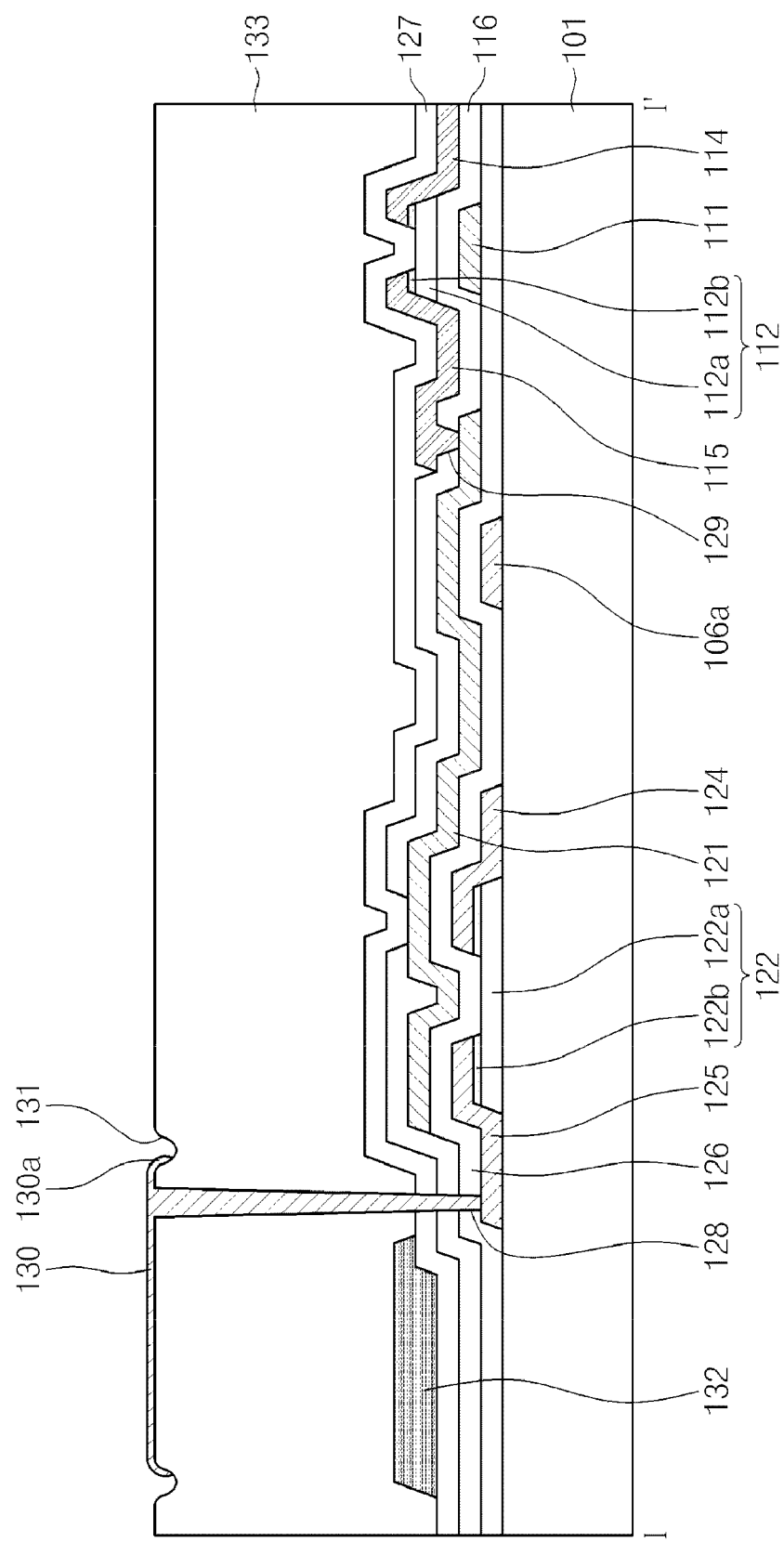

The present invention will be described more fully hereinafter with reference to the accompanying drawings, in which preferred embodiments of the inventions invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

An organic light emitting display device according to an exemplary embodiment of the invention will be described with reference to FIG. 1.

FIG. 1 is an equivalent circuit diagram of an organic light emitting display device according to an embodiment of the present invention.

Referring to FIG. 1, the organic light emitting display device includes a plurality of signal lines 102, 104, and 106 and a plurality of pixels PX arranged in a matrix shape.

The signal lines include a plurality of gate lines 102 for transmitting gate signals (or scanning signals), a plurality of data lines 104 for transmitting data signals, and a plurality of power supply lines 106 for transmitting a driving voltage. The gate lines 102 extend substantially in a row direction and substantially parallel to each other. The data lines 104 and the power supply lines 106 extend substantially in a column direction and substantially parallel to each other. In another embodiment, the power supply lines 106 may extend in a direction substantially parallel to the gate lines 102. In another embodiment, the power supply lines 106 may have a net shape and extend in a direction substantially parallel to the gate lines 102 and a direction substantially parallel to the data lines 104.

Each pixel PX includes a switching thin film transistor T1, a driving thin film transistor T2, a storage capacitor C, and an organic light emitting diode LD.

The switching thin film transistor T1 has a control terminal connected to one of the gate lines 102, an input terminal connected to one of the data lines 104, and an output terminal connected to the driving thin film transistor T2. The switching thin film transistor T1 transmits the data signals applied to the data line 104 to the driving thin film transistor T2 in response to the gate signal applied to the gate line 102.

The driving thin film transistor T2 has a control terminal connected to the switching thin film transistor T1, an input terminal connected to the driving signal line 106, and an output terminal connected to the organic light emitting diode LD. The driving thin film transistor T2 drives an output current $I_{LD}$ having a magnitude depending on the voltage between the control terminal and the output terminal thereof.

The storage capacitor C is connected between the control terminal and the output terminal of the driving thin film transistor T2. The storage capacitor C stores the data signal applied to the control terminal of the driving thin film transistor T2 and maintains the data signal after the switching thin film transistor T2 turns off.

The organic light emitting diode LD has an anode connected to the output terminal of the driving thin film transistor T2 and a cathode connected to a common voltage Vss. The anode functions as a pixel electrode and the cathode functions as a common electrode. The organic light emitting diode LD emits light having intensity depending on an output current $I_{LD}$ of the driving thin film transistor T2 and an image is displayed.

The switching thin film transistor T1 and the driving thin film transistor T2 are n-channel field effect transistors. However, the switching thin film transistor T1 and/or the driving thin film transistor T2 may be a p-channel field effect transistor. In another embodiment, the connection configurations among the switching thin film transistor T1, the driving thin film transistor T2, the storage capacitor C, and the organic light emitting diode LD may be modified.

A detailed structure of the organic light emitting display device of FIG. 1 will be described in detail with reference to FIGS. 2 to 11 and 14.

A plurality of driving semiconductors 122a is formed on a substrate 101.

The substrate 101 includes an insulating material such as transparent glass or plastic.

The driving semiconductor 122a may include a crystalline semiconductor material such as microcrystalline silicon or polycrystalline silicon. In one embodiment, the driving semiconductor 122a is formed by a solid phase crystallization process using infrared and/or a magnetic field.

A plurality of driving input electrodes 124, a plurality of driving output electrodes 125 and a plurality of power supply lines 106 are formed on the driving semiconductor 122a.

The input electrodes 124 are extended from the power supply lines 106. A driving input electrode 124 and a driving output electrode 125 are disposed on opposite sides of each other with respect to the driving semiconductor 122a.

In one embodiment, the driving input electrodes 124, the driving output electrodes 125 and the power supply lines 106 include an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ta, Ti, etc. The driving input electrodes 124, the driving output electrodes 125 and the power supply lines 106 may have a multi-layered structure including two films having different physical characteristics.

The lateral sides of the driving input electrodes 124, the driving output electrodes 125 and the power supply lines 106 are inclined relative to a surface of the substrate 101, and the inclination angle thereof is in a range from about 30 to about 80 degrees.

A plurality of ohmic contacts 122b is formed between the driving semiconductor 122a and the driving input electrode 124, and between the driving semiconductor 122a and the driving output electrode 125, respectively.

In one embodiment, the ohmic contacts 122b include a crystalline semiconductor material such as microcrystalline silicon or n+hydrogenated a-Si heavily doped with an n-type impurity such as phosphorus.

A gate insulating layer 126 is formed on the driving input electrodes 124, the driving output electrodes 125 and the power supply lines 104. In one embodiment, the gate insulating layer 126 includes silicon oxide (SiOx) or silicon nitride (SiNx). The gate insulating layer 126 may have a single-layered structure, or may have a multi-layered structure including a first layer of silicon oxide and a second layer of silicon nitride.

A plurality of driving control electrodes 121, a plurality of switching control electrodes 111 and a plurality of gate lines 102 are formed on the gate insulating layer 126.

Each of the switching control electrodes 111 is extended from each of the gate lines 102 and each of the driving control electrodes 121 is separated from each of the gate lines 102.

The driving control electrodes 121, the switching control electrodes 111 and the gate lines 102 may include the same material as power supply lines 106.

The driving control electrodes 121, the switching control electrodes 111 and the gate lines 102 have inclined edge profiles, and the inclination angles thereof are in a range from about 30 to about 80 degrees.

A portion 106a of the power supply line 106 and a portion of the driving control electrode 121 overlaps to form a storage capacitor C.

A second gate insulating layer 116 is formed on the driving control electrodes 121, the switching control electrodes 111 and the gate lines 102. In one embodiment, the second gate insulating layer 116 includes silicon oxide (SiOx) or silicon nitride (SiNx)

A plurality of switching semiconductors 112a including hydrogenated a-Si is formed on the second gate insulating layer 116. The switching semiconductor 112a overlaps the switching control electrodes 111.

A plurality of switching input electrodes 114, a plurality of switching input electrodes 115 and a plurality of data lines 104 are formed on the switching semiconductor 112a.

Each of the switching input electrodes 114 is extended from each of the data lines 104.

A plurality of ohmic contacts 112b are formed between the switching semiconductors 112a and the switching input electrodes 114, and between the switching semiconductors 112a and the switching output electrodes 115, respectively. In one embodiment, the ohmic contacts 112b includes n+hydrogenated a-Si heavily doped with an n-type impurity such as phosphorus.

The switching output electrode 115 is connected to the driving control electrode 121 through a first contact hole 129 formed in the second gate insulating layer 116. The switching output electrode 115 is in direct contact with the driving control electrode 121. Because the switching output electrode 115 is directly connected to the driving control electrode 121 without an auxiliary electrode, the process becomes simplified. Moreover, the contact resistance between the switching output electrode 115 and the driving control electrode 121 is lowered.

A passivation layer 127 is formed on the switching input electrodes 114, the switching input electrodes 115 and the data lines 104.

The passivation layer 127 includes an inorganic layer such as silicon nitride or silicon oxide.

In one embodiment, a color filter 132 is formed on the passivation layer 127. The color filter 132 is formed on at least one of the sub-pixel areas. In one embodiment, the sub-pixel areas include a red sub-pixel area, a green sub-pixel area, a blue sub-pixel area and a white sub-pixel area. The red sub-pixel area, the green sub-pixel area, the blue sub-pixel area and the white sub-pixel area form a pixel unit area. Each sub-pixel area includes a sub-pixel. Examples of the sub-pixel include a red sub-pixel, a green sub-pixel, a blue sub-pixel and a white sub-pixel. The red sub-pixel, the green sub-pixel, the blue sub-pixel and the white sub-pixel form a pixel unit. In one embodiment, a red color filter is formed on the red sub-pixel area, a green color filter is formed on the green sub-pixel area, and a blue color filter is formed on the blue sub-pixel area.

An insulating layer 133 is formed on the color filter 132, and a pixel electrode 130 is formed on the insulating layer 133.

The insulating layer 133 covers uneven surfaces of the color filter 132 and serves as a leveling layer. In one embodiment, the insulating layer 133 includes an organic material. The insulating layer has a groove 131. The groove has a width of about 0.2 to about 4 µm. The groove has a depth of about 0.2 to about 4 µm. When the width and the depth of the groove is beyond the scope, the pixel electrode 130 may be formed outside the groove, or the groove 131 may penetrate the insulating layer 133. In one embodiment, the pixel electrode 130 has a thickness of about 0.1 µm and the groove has a width of about 0.5 µm and a depth of about 0.5 µm to contain the edge 130a of the pixel electrode 130. In one embodiment, the groove is formed along a boundary of the pixel electrode.

A second contact hole 128 is formed together with the groove. The second contact hole 128 exposes at least a portion of the driving output electrode 125. The second contact hole 128 is formed through the insulating layer 133, the passivation layer 127, the second gate insulating layer 116 and the first gate insulating layer 126.

The pixel electrodes 130 are connected to the driving output electrodes 125 through the second contact hole 128.

The pixel electrodes 130 may include a transparent conductor such as indium tin oxide or indium zinc oxide. Alternatively, when the organic light emitting display device according to an exemplary embodiment of the present invention is a top-emission type, the pixel electrodes 130 may include an opaque conductor such as Al or an Al alloy, Au, Pt, Ni, Cu, or W that have a high work function, or alloys thereof.

The pixel electrode 130 has an edge 130a declined in the groove 131. Usually, pixel electrode 130 has a steep taper angle. If an organic light emitting member 134 on the pixel electrode 130 is not thick enough to cover the edge 130a of the pixel electrode 130, the pixel electrode 130 becomes connected with the common electrode 136 and a short circuit is generated. In this embodiment, because the edge 130a of the pixel electrode 130 is declined in the groove 131, the possibility of the short circuit between the pixel electrode 130 and a common electrode 136 is lowered. Because the edge 130a of the pixel electrode 130 is stably formed in the groove of the insulating layer 133, the process of forming a partition could be omitted.

In this embodiment, a portion of the color filter 132 that is usually covered by the partition can serve as a display pixel area to improve the aperture ratio of the display device.

Hereinafter, a process of forming the insulating layer 133 will be explained in detail.

Figure 11A:
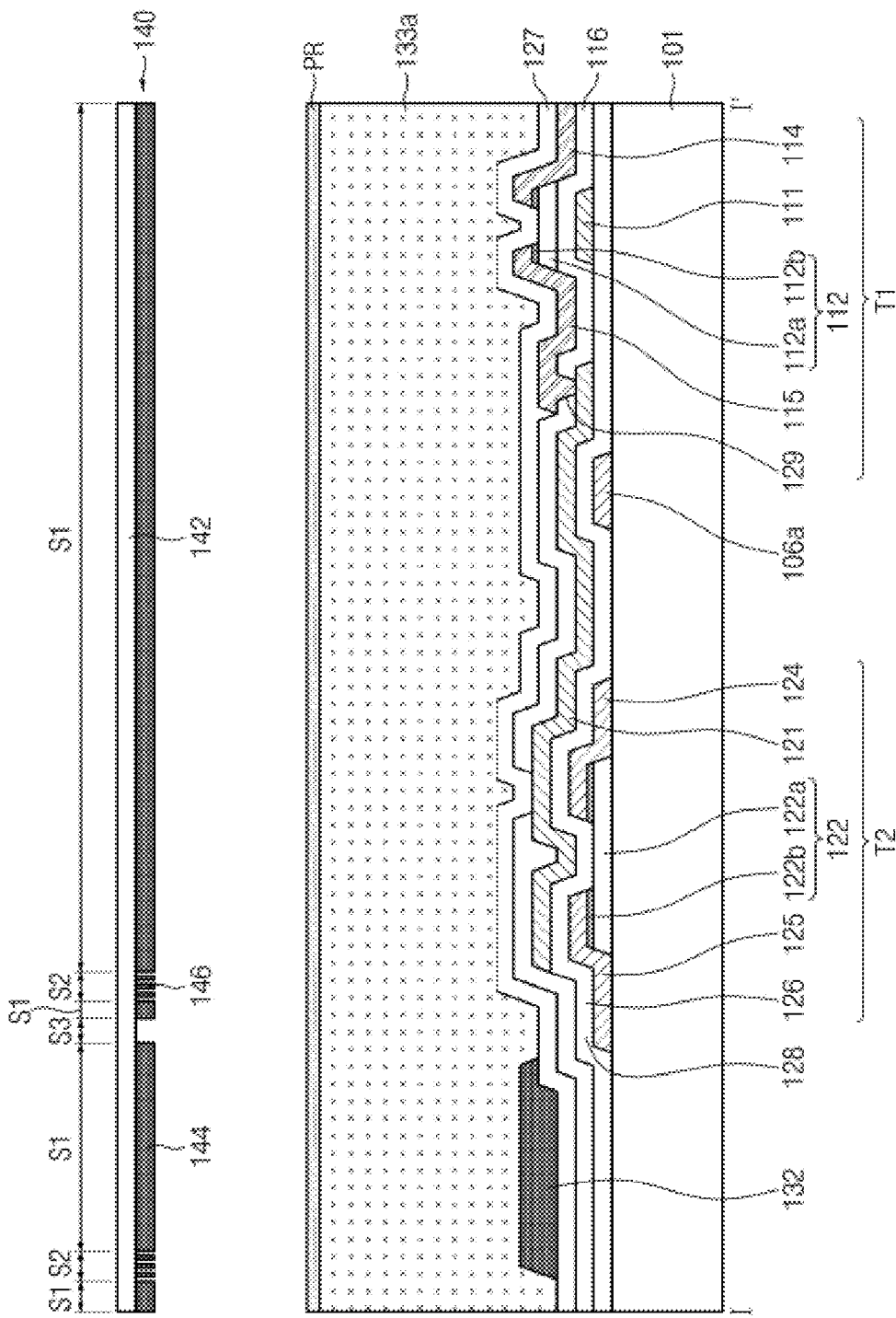
Figure 11B:
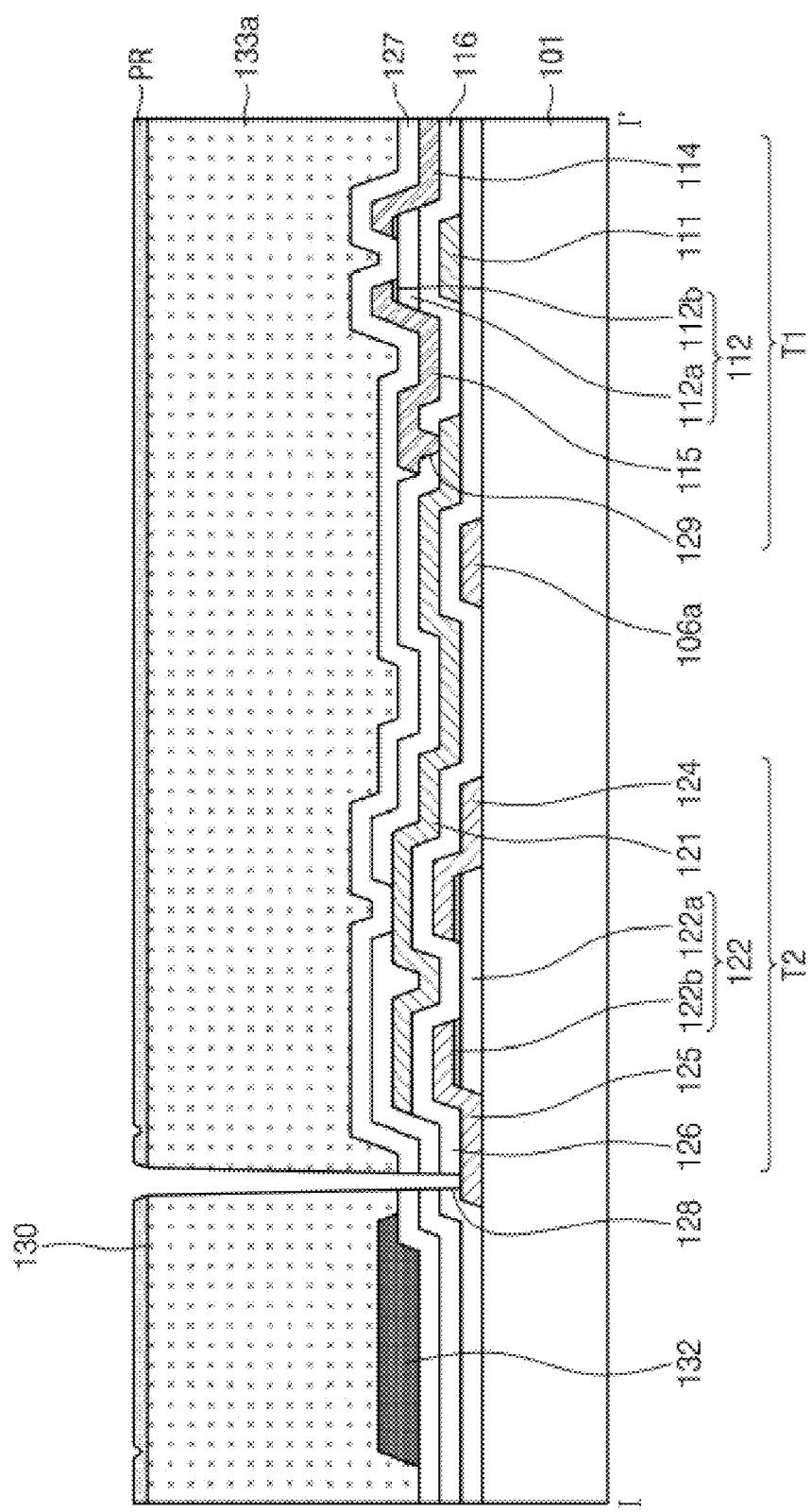
Figure 11C:
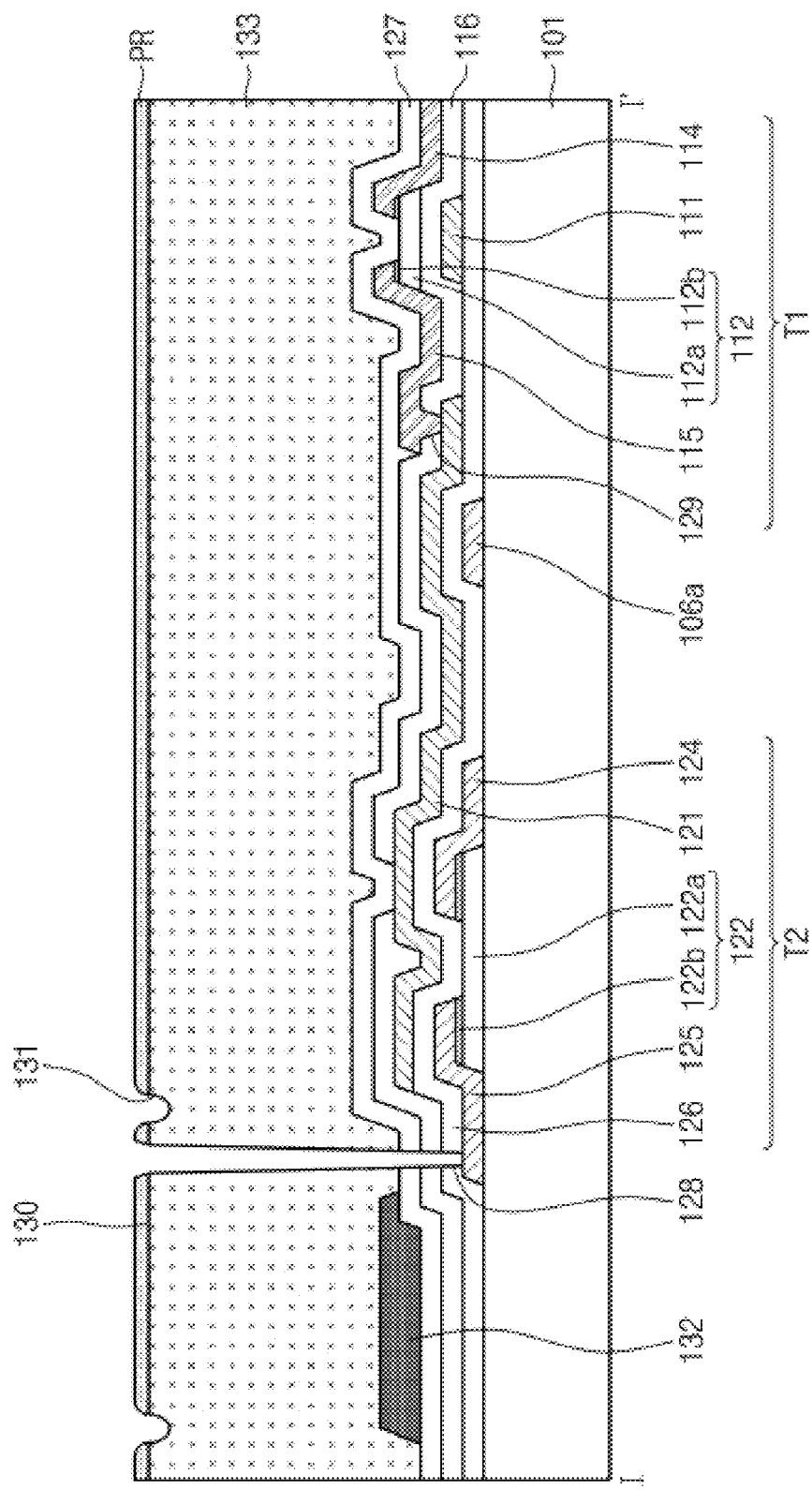

Referring to FIGS. 11A to 11C, a photoresist material PR is formed on an insulating material 133a. The photoresist material PR is exposed to light through a mask 140 having slits. The mask 140 has at least one light blocking area S1, at least one slit area S2 and at least one light penetrating area S3. The second contact hole 128 is formed in the light penetrating area S3 and the groove 131 is formed in the slit area S2.

The photoresist material PR is exposed and then developed. In a first developing process, the photoresist material PR in the light penetrating area S3 is removed and a portion of the photoresist material PR in the slit area S2 is removed. The exposed insulating layer 133a, the passivation layer 127, the second gate insulating layer 116 and the first gate insulating layer 126 are then dry etched to form the second contact hole 128 exposing the driving output electrode 125.

In a second developing process, the photoresist material PR in the slit area S2 is removed to expose a portion of the insulating layer 133. A second etching process is performed to form the groove 131. The remaining photoresist material PR is then stripped. In another embodiment, other masks such as a half-tone mask may be used instead of the slit mask.

Figure 12:
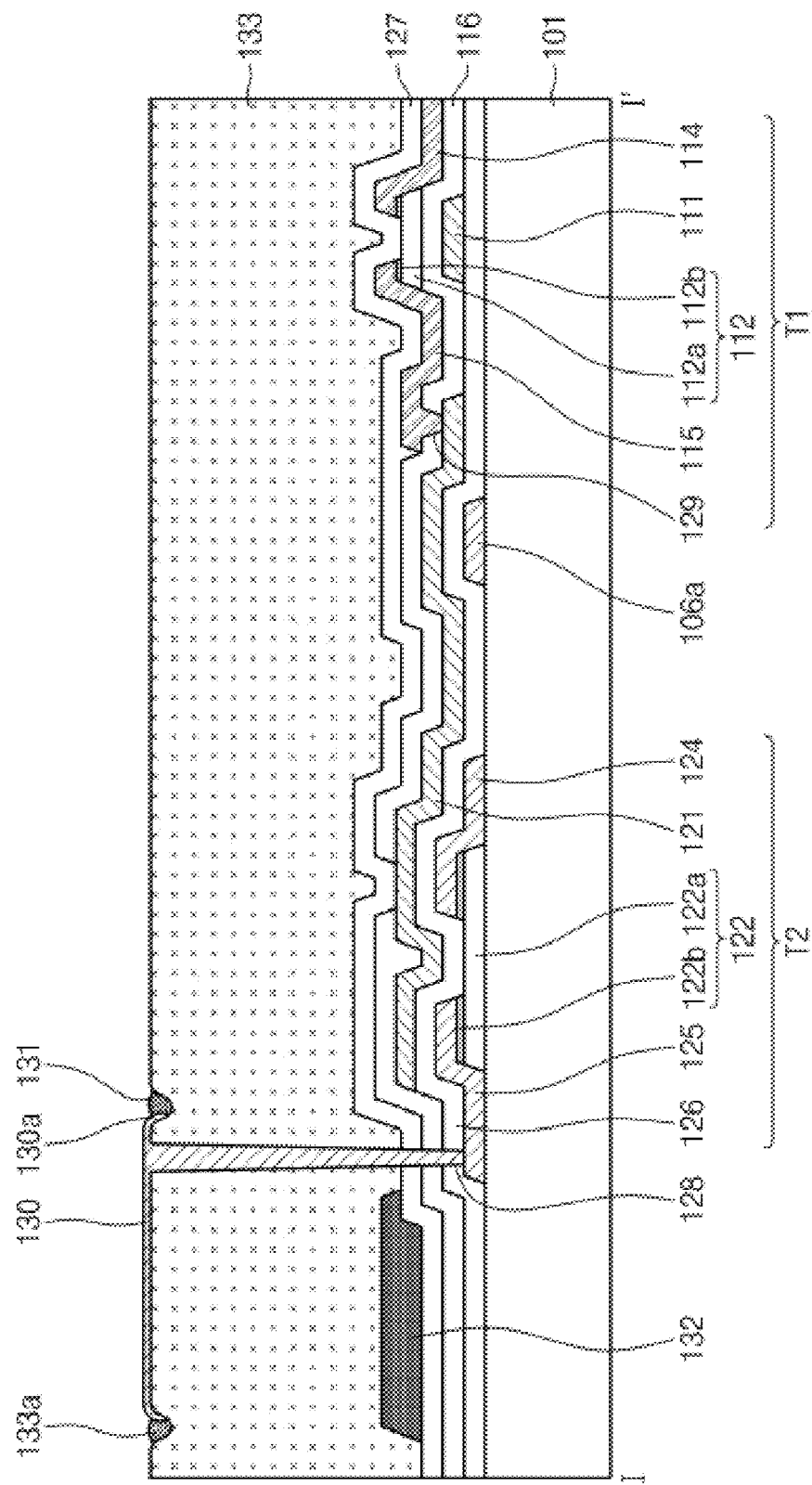
FIG. 12 is a cross-sectional view illustrating a process of insulating the edge of the pixel electrode according to another embodiment of the invention.

FIG. 12 is a cross-sectional view illustrating a process of insulating the edge 130a of the pixel electrode 130 according to another embodiment of the invention.

Referring to FIG. 12, the insulating layer 133 is cured after the pixel electrode 130 is formed. When the insulating layer 133 is cured, a portion 133a of the insulating layer 133 reflows to cover the edge 130a of the pixel electrode 130. The insulating layer is thermally cured or cured by light.

In one embodiment, the insulating layer 133 is primarily cured before the pixel electrode 130 is formed. While the formation of the pixel electrode 130, the insulating layer 133 is developed using a developer for the pixel electrode 130. The developer may dissolve the insulating layer 133 and the insulating layer 133 may cover the edge of the pixel electrode 133. The insulating layer 133 is secondarily cured at a temperature higher than the primary curing.

In this embodiment, the edge 130a of the pixel electrode 130 is securely insulated from the common electrode 136 by the reflowed insulating layer 133 without using a photolithography process.

The organic light emitting display device may further include a cover member 138 (see FIG. 13B) covering the edge 130a of the pixel electrode 130. The cover member 138 secures insulation between the pixel electrode 130 and the common electrode 136.

Figure 13A:
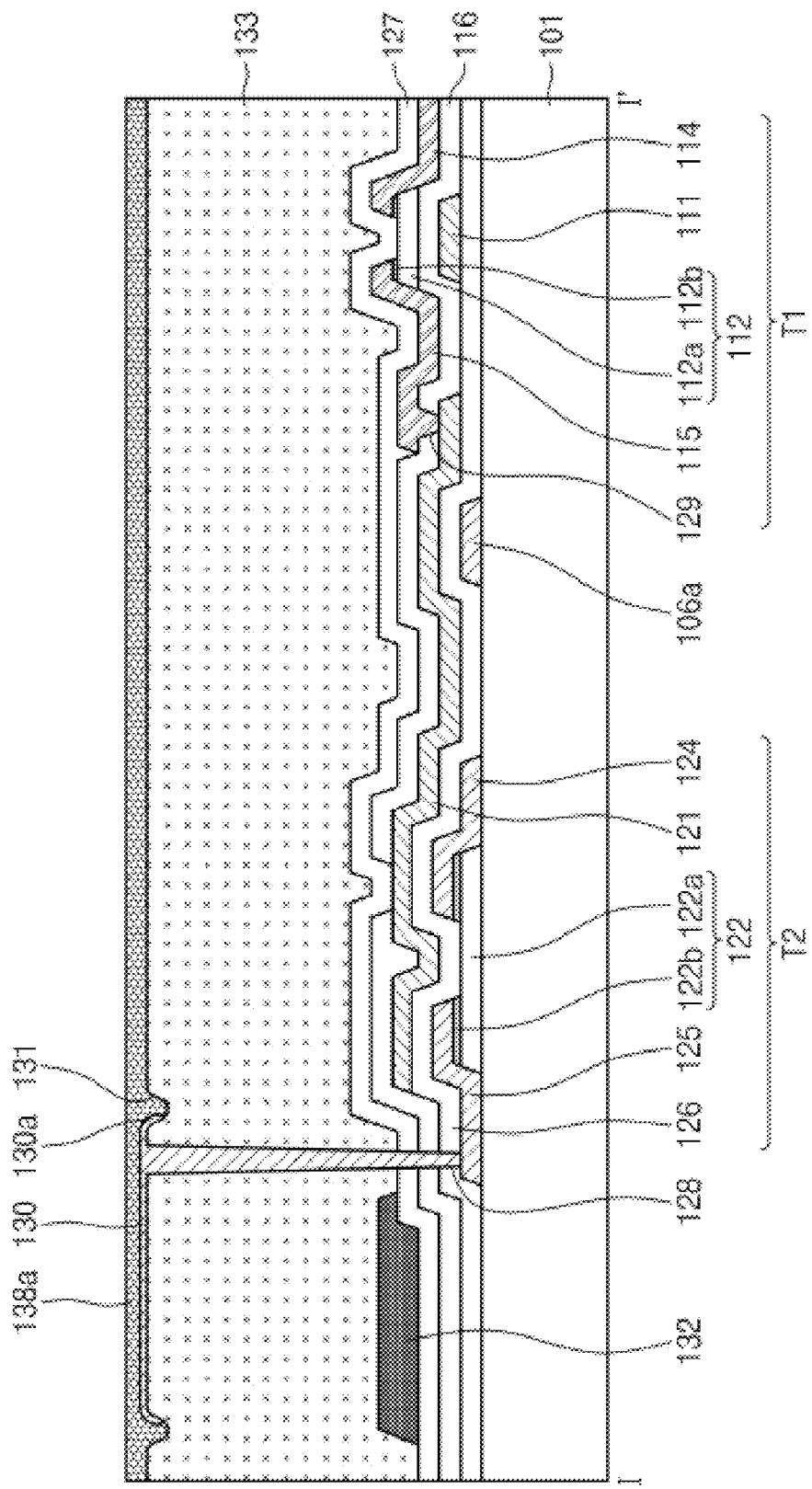
FIGS. 13A and 13B are cross-sectional views illustrating a process of forming a cover member according to another embodiment of the invention.
Figure 13B:
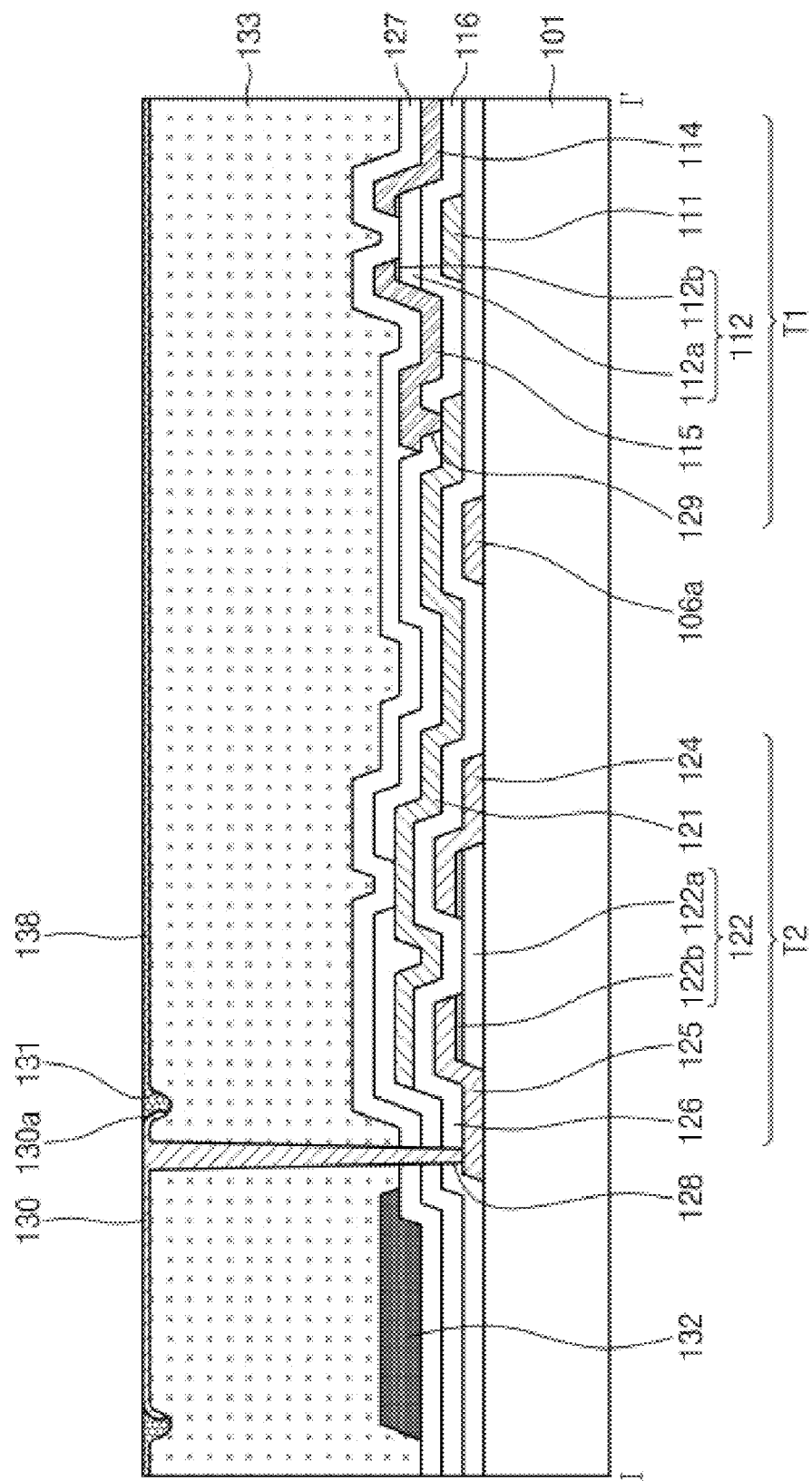

A process of forming the cover member 138 will be explained in detail. Referring to FIG. 13A, an organic material 138a is coated on the entire surface of the substrate having the pixel electrode 130 formed thereon. Referring to FIG. 13B, the organic material 138a is ashed such that a position of an upper surface of the cover member 138 is substantially the same or is lower than a position of an upper surface of the pixel electrode 130.

In this embodiment, the edge 130a of the pixel electrode 130 is securely insulated without using a photolithography process.

Figure 14:
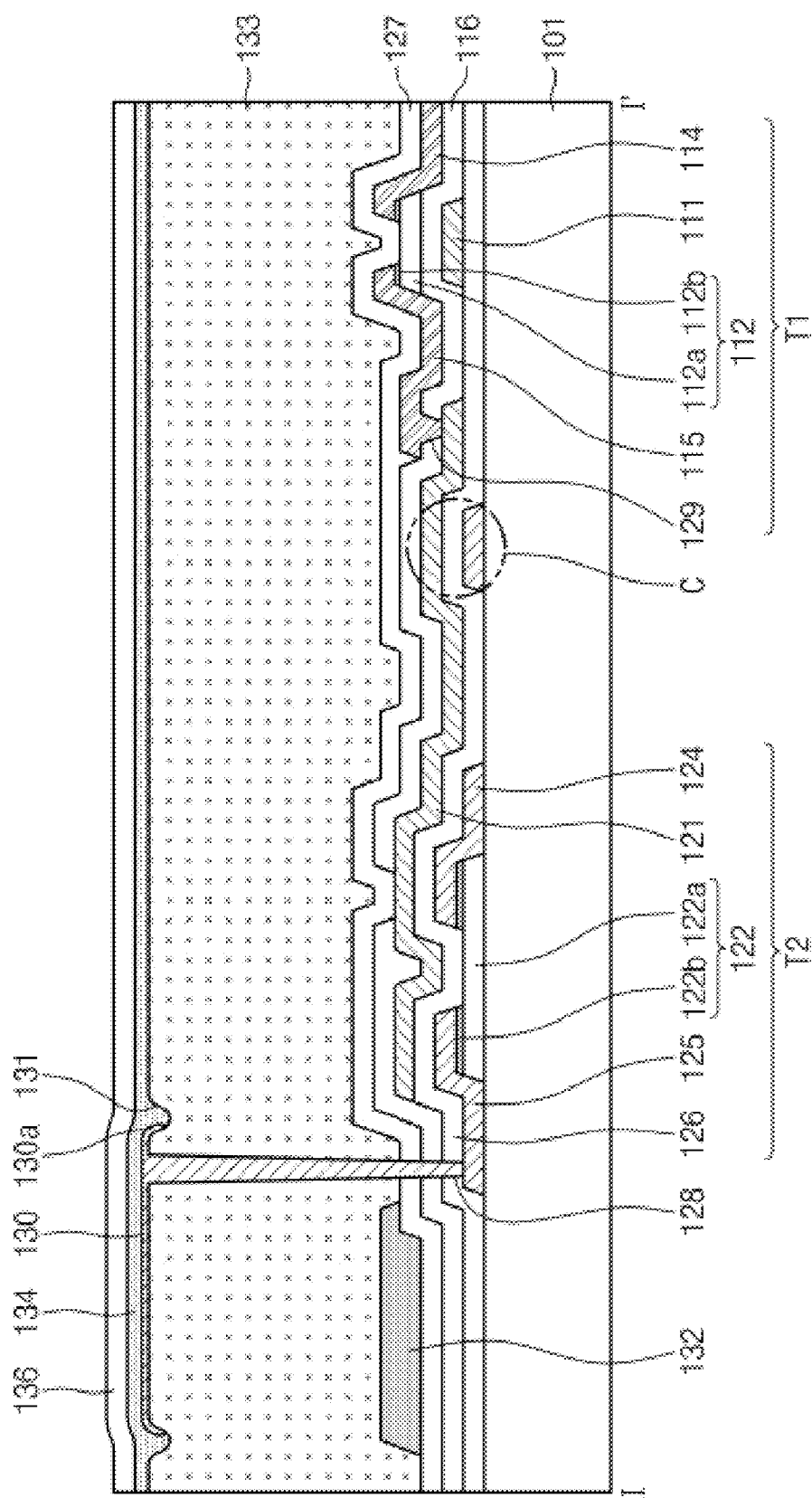

Referring to FIG. 14, an organic light emitting member 134 is formed on the pixel electrodes 130.

Because a partition is not formed, the organic light emitting member 134 contacts the entire surface of the pixel electrode 130.

The organic light emitting member 134 has at least two layers. In one embodiment, the organic light emitting member 134 includes a hole injection layer, a hole transport layer, an organic light emitting layer, an electron injection layer and an electron transport layer. The lowest layer of the organic light emitting member 134 is in direct contact with the pixel electrode 130, and the lowest layer contacts the entire surface of the pixel electrode 130. In one embodiment, the hole injection layer becomes the lowest layer.

In one embodiment, the organic light emitting layers include a low molecular weight material.

Examples of the low molecular weight materials include anthracene such as 9,10-diphenylanthracene, butadiene such as tetraphenylbutadiene, tetracene, a distyrylarylene derivative, a benzazole derivative, a carbazole derivative, etc. Alternatively, the low molecular weight material is used as a host. The host is doped by a dopant such as xanthene, perylene, cumarine, rhodamine, rubrene, a dicyanomethylenepyran compound, a thiopyran compound, a (thia)pyrilium compound, a periflanthene derivative, an indenoperylene derivative, a carbostyryl compound, Nile red, and quinacridone to enhance the efficiency of light emission.

In one embodiment, a red organic light emitting layer, a green organic light emitting layer and a blue organic light emitting layer are vertically formed in each pixel.

The red organic light emitting layer, the green organic light emitting layer and the blue organic light emitting layer are formed not only in each sub-pixel areas but also areas outside the sub-pixel areas. The red organic light emitting layer, the green organic light emitting layer and the blue organic light emitting layer are formed all over a display area. In one embodiment, the vertically stacked red organic light emitting layer, the green organic light emitting layer and the blue organic light emitting layer emit white light all together and each sub-pixel emits red, green, blue or white color after passing through the color filter 132 if a color filter exists under the pixel electrode of the sub-pixel.

In another embodiment, the organic light emitting layers include a polymer. Examples of the polymers include a polyfluorene derivative, a (poly)paraphenylenevinylene derivative, a polyphenylene derivative, polyvinylcarbazole, a polythiophene derivative, etc.

In one embodiment, the hole transport layer and/or the hole injecting layer including a material having a work function of a magnitude are intermediate between the pixel electrode 130 and the organic light emitting layer. The electron transport layer and/or the electron injecting layer including a material having a work function are intermediate between the common electrode 136 and the organic light emitting layer. Examples of the hole transport layer and the hole injecting layer include a diamine compound, [4,4',4''-tris (3-methylphenyl) phenylamino]triphenylamine (MTDATA), N,N'-diphenyl-N,N'-di(3-methylphenyl)-1,1'-biphenyl-4,4'-diamine (TPD), 1,1-bis(4-di-p-tolylaminophenyl)cyclohexane, N,N,N',N'-tetra(2-naphthyl)-4,4-diamino-p-terphenyl, 4,4',4-tris[(3-methylphenyl)phenylamino]triphenylamine, polypyrrole, polyaniline, or a mixture of poly-3,4-ethylenedioxythiophene and polystyrenesulfonate (PEDOT:PSS).

Four sub-pixels for red, green, blue, and white may be disposed in a stripe shape or a mosaic shape.

The common electrode 136 is formed on the light emitting members 134. The common electrode 136 is formed on the entire surface of the organic light emitting members 134, and applies a current to the organic light emitting member 134 along with the pixels electrodes 130.

The pixel electrode 130, the organic light emitting member 134, and the common electrode 136 form an organic light emitting diode LD.

In embodiments of the present invention, it is described that each of the pixels includes one switching thin film transistor T1 and one driving thin film transistor T2, but they may further include at least one transistor and a plurality of wires such that deterioration of the organic light emitting diode LD and the driving thin film transistor T1 is compensated and the lifetime of the organic light emitting diode is improved.

As described above, according to one embodiment of the invention, a process of forming a partition can be omitted. Therefore, the overcall processing time is reduced and conventional problem that moisture, oxygen or solvent permeated in the partition deteriorates organic layer can be minimized. Moreover, a portion of the color filter that was covered by the partition can be used as a display pixel area to improve the aperture ratio of the display device. Because the switching output electrode is in direct contact with the driving control electrode, the contact resistance between the switching output electrode and the driving control electrode is lowered.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. An organic light emitting display device comprising:
   a substrate having a plurality of sub-pixel areas;
   a switching thin film transistor formed on each of the sub-pixel areas, wherein the switching thin film transistor has a first control electrode, a first input electrode and a first output electrode;
   a driving thin film transistor connected to the switching thin film transistor, wherein the driving thin film transistor has a second control electrode, a second input electrode and a second output electrode;
   a color filter formed on at least one of sub-pixel areas;
   an insulating layer formed on the switching thin film transistor and the driving thin film transistor, wherein the insulating layer has a groove and a contact hole;
   a pixel electrode electrically connected to the driving thin film transistor through the contact hole, the pixel electrode extending to the groove to be partially contained in the groove;
   wherein the pixel electrode has an edge declined in the groove; a cover member covering the edge of the pixel electrode; wherein the cover member comprises an organic material and a position of an upper surface of the cover member is substantially the same or is lower than a position of an upper surface of the pixel electrode;
   an organic light emitting member formed on the pixel electrode; and
   a common electrode formed on the organic light emitting member.

2. The device of claim 1, wherein the groove is formed along a boundary of the pixel electrode.

3. The device of claim 1, wherein the groove has a width of about 0.2 to about 4 μm.

4. The device of claim 1, wherein the groove has a depth of about 0.2 to about 4 μm.

5. The device of claim 1, wherein the sub-pixel areas comprises a red sub-pixel area, a green sub-pixel area, a blue sub-pixel area and a white sub-pixel area, and wherein the red sub-pixel area, the green sub-pixel area, the blue sub-pixel area and the white sub-pixel area form a pixel unit area.

6. The device of claim 1, wherein the first output electrode is in direct contact with the second control electrode.

7. The device of claim 1, wherein the groove has a depth that is less than a depth of the contact hole.

8. An organic light emitting display device comprising:
a substrate having a plurality of sub-pixel areas;
a switching thin film transistor formed on each of the sub-pixel areas;
a driving thin film transistor connected to the switching thin film transistor;
an insulating layer having a groove and a contact hole formed on the driving thin film transistor;
a pixel electrode connected to the driving thin film transistor;
wherein the pixel electrode has an edge declined in the groove; a cover member covering the edge of the pixel electrode; wherein the cover member comprises an organic material and a position of an upper surface of the cover member is substantially the same or is lower than a position of an upper surface of the pixel electrode;
an organic light emitting member disposed on the pixel electrode and the insulating layer to cover an entire upper surface of each of the pixel electrode and the insulating layer; and
a common electrode formed on the organic light emitting member.

9. The device of claim 8, wherein, the driving thin film transistor is electrically connected to the pixel electrode through the contact hole, and the pixel electrode extends to the groove to be partially contained in the groove.

10. The device of claim 9, wherein the groove is formed along a boundary of the pixel electrode.

11. The device of claim 9, wherein the groove has a depth that is less than a depth of the contact hole.

12. The device of claim 8, wherein the light emitting member comprises a hole injection layer, a hole transport layer, an organic light emitting layer, an electron injection layer and an electron transport layer.

* * * * *